US011387374B2

(12) United States Patent
Butler et al.

(10) Patent No.: US 11,387,374 B2
(45) Date of Patent: Jul. 12, 2022

(54) OPTOELECTRONIC PACKAGE ASSEMBLIES INCLUDING SOLDER REFLOW COMPATIBLE FIBER ARRAY UNITS AND METHODS FOR ASSEMBLING THE SAME

(71) Applicant: CORNING RESEARCH & DEVELOPMENT CORPORATION, Corning, NY (US)

(72) Inventors: Douglas Llewellyn Butler, Painted Post, NY (US); James Scott Sutherland, Painted Post, NY (US)

(73) Assignee: Corning Research & Development Corporation, Corning, NY (US)

(*) Notice: Subject to any disclaimer, the term of this patent is extended or adjusted under 35 U.S.C. 154(b) by 11 days.

(21) Appl. No.: 17/087,209

(22) Filed: Nov. 2, 2020

(65) Prior Publication Data

US 2021/0159347 A1    May 27, 2021

Related U.S. Application Data

(60) Provisional application No. 62/940,405, filed on Nov. 26, 2019.

(51) Int. Cl.
*H01L 31/0232* (2014.01)
*H01L 21/50* (2006.01)
(Continued)

(52) U.S. Cl.
CPC .......... *H01L 31/0232* (2013.01); *H01L 21/50* (2013.01); *H01L 31/0224* (2013.01); *H01L 31/18* (2013.01); *H01L 2021/60135* (2013.01)

(58) Field of Classification Search
CPC .. H01L 27/14; H01L 27/142; H01L 31/02327
See application file for complete search history.

(56) References Cited

U.S. PATENT DOCUMENTS 6,945,712 B1 * 9/2005 Conn ................... G02B 6/4246
385/94
7,452,140 B2   11/2008 Ito et al.
(Continued)

FOREIGN PATENT DOCUMENTS

JP   2000-227530 A    8/2000
JP   2014-230326 A   12/2014
(Continued)

OTHER PUBLICATIONS

European Patent Application No. 20207908.3, Extended European Search Report dated Apr. 6, 2021; 11 pages; European Patent Office.

*Primary Examiner* — Jae Lee
(74) *Attorney, Agent, or Firm* — Grant A. Gildehaus

(57) ABSTRACT

A method for assembling an optoelectronic package assembly includes engaging a connector holder with a substrate, the connector holder defining an engagement feature and the substrate including optical waveguides, engaging a connector of a fiber array unit with the engagement feature the connector holder where the engagement feature retains the connector and where the fiber array unit includes the connector and optical fibers coupled to the connector, optically coupling the optical fibers to the optical waveguides of the substrate, heating the connector holder, the fiber array unit, the substrate, and a solder positioned between the substrate and a base substrate, where the heating is sufficient to melt the solder, and cooling the solder to couple the substrate to the base substrate.

26 Claims, 9 Drawing Sheets

(51) Int. Cl.
*H01L 31/0224* (2006.01)
*H01L 31/18* (2006.01)
*H01L 21/60* (2006.01)

(56) References Cited

U.S. PATENT DOCUMENTS

| | | |
|---|---|---|
| 9,465,176 B2 | 10/2016 | Pommer et al. |
| 10,345,535 B2 | 7/2019 | Butler et al. |
| 10,782,474 B2 | 9/2020 | Brusberg et al. |
| 2010/0215317 A1 | 8/2010 | Rolston et al. |
| 2012/0183256 A1 | 7/2012 | Shao et al. |
| 2016/0124164 A1 | 5/2016 | Doerr |
| 2016/0377823 A1* | 12/2016 | Garland ............... G02B 6/4271 385/14 |
| 2019/0036618 A1* | 1/2019 | Hasharoni ............. H04B 10/40 |
| 2019/0302379 A1* | 10/2019 | Raghunathan ........ H01L 25/167 |
| 2019/0391350 A1* | 12/2019 | Evans .................. G02B 6/4292 |
| 2020/0091676 A1* | 3/2020 | Karplus ............. H01S 5/02253 |

FOREIGN PATENT DOCUMENTS

| | | |
|---|---|---|
| WO | 2002/065600 A2 | 8/2002 |
| WO | 2018/165016 A1 | 9/2018 |
| WO | 2018/165061 A1 | 9/2018 |

* cited by examiner

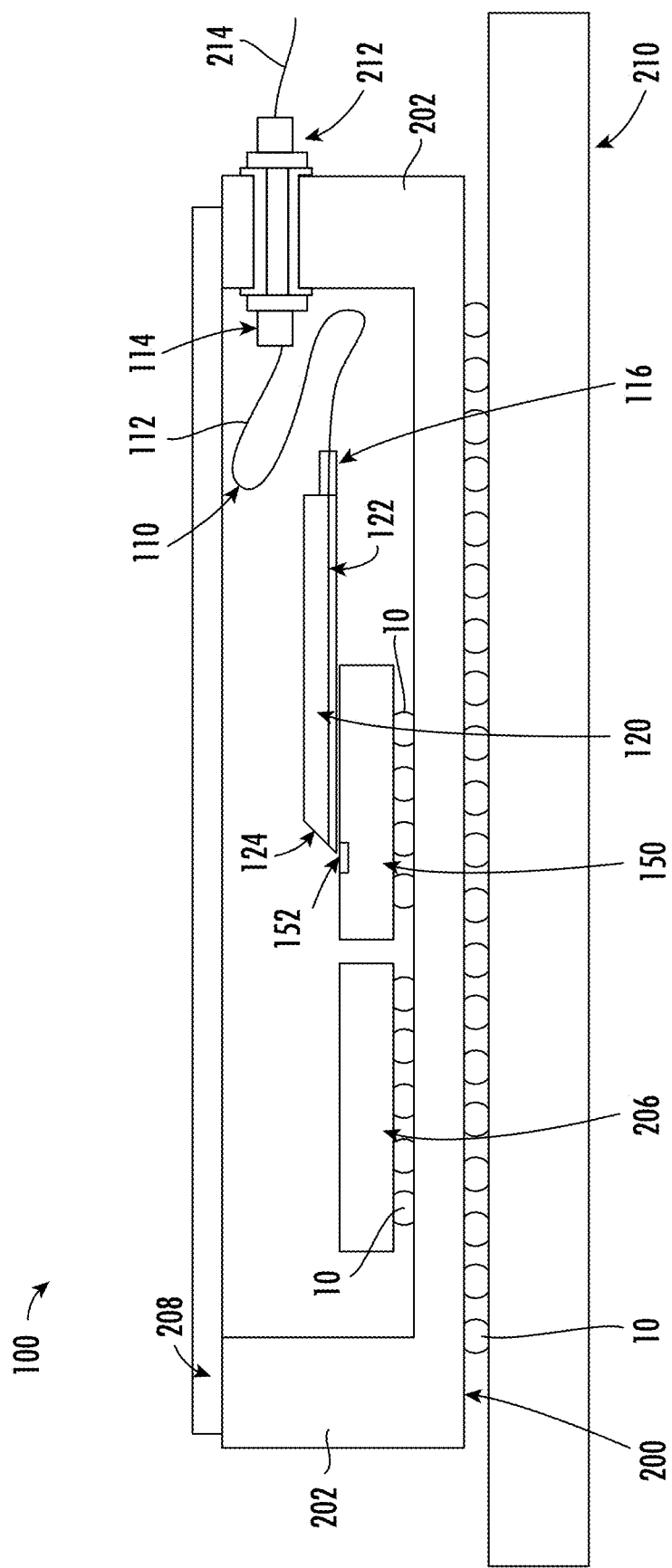

OPTOELECTRONIC PACKAGE ASSEMBLIES INCLUDING SOLDER REFLOW COMPATIBLE FIBER ARRAY UNITS AND METHODS FOR ASSEMBLING THE SAME

PRIORITY APPLICATION

This application claims the benefit of priority of U.S. Provisional Application No. 62/940,405, filed on Nov. 26, 2019, the content of which is relied upon and incorporated herein by reference in its entirety.

BACKGROUND

The present disclosure generally relates to optoelectronic package assemblies including solder reflow compatible fiber array units, and methods for assembling optoelectronic package assemblies that include solder reflow compatible fiber array units.

Communication networks are used to transport a variety of signals such as voice, video, data transmission, and the like. Data centers that process data streams conventionally include rack-mounted switches that have switch circuit boards including switch application specific integrated circuits (ASICs) fed by electrical traces. As bit rates of the ASICs have increased, crosstalk and signal loss along the electrical traces has increased.

To reduce crosstalk and signal loss, some ASIC designs include optoelectronic transceivers positioned on a module together with the ASIC. However, conventional methods for assembling an optoelectronic package including electronic components and optoelectronic components generally include either the temporary removal of some of the optical components as the electronic components are soldered to a substrate, and/or may include optically aligning the optical components after the electronic components are soldered to the substrate. Removal and re-installation of these optical components sometimes introduces stresses and strains to the components of the optoelectronic package, which can lead to component failure. Further, the optical alignment of the optical components after the electronic components are already soldered to the substrate may be difficult and may generally increase manufacturing costs.

Accordingly, a need exists for new optoelectronic package assemblies and new methods for assembling optoelectronic package assemblies including fiber array units.

SUMMARY

In one embodiment, a method for assembling an optoelectronic package assembly includes engaging a connector holder with a substrate, the connector holder defining an engagement feature and the substrate including optical waveguides, engaging a connector of a fiber array unit with the engagement feature the connector holder where the engagement feature retains the connector and where the fiber array unit includes the connector and optical fibers coupled to the connector, optically coupling the optical fibers to the optical waveguides of the substrate, heating the connector holder, the fiber array unit, the substrate, and a solder positioned between the substrate and a base substrate, where the heating is sufficient to melt the solder, and cooling the solder to couple the substrate to the base substrate.

In another embodiment, a method for assembling an optoelectronic package assembly includes engaging a connector holder with a substrate, the connector holder defining an engagement feature and the substrate including optical waveguides, engaging a connector of a fiber array unit with the engagement feature the connector holder where the engagement feature retains the connector and where the fiber array unit includes the connector and optical fibers coupled to the connector, optically coupling the optical fibers to the optical waveguides of the substrate such that the optical fibers to the optical waveguides have a lateral alignment between the optical fibers and the optical waveguides, heating the connector holder, the fiber array unit, the substrate, and a solder positioned between the substrate and a base substrate by exposing the connector holder, the fiber array unit, the substrate, and the solder positioned between the substrate and the base substrate to temperatures between about 240 degrees Celsius and 270 degrees Celsius, and cooling the solder to couple the substrate to the base substrate, where the lateral alignment between the optical fibers and the optical waveguides changes by less than 1.0 micrometer following the heating and cooling steps.

In yet another embodiment, an assembly includes a fiber array unit including a connector and optical fibers coupled to the connector, a substrate including optical waveguides that are optically coupled to the optical fibers, where the optical waveguides and the optical fibers have a lateral alignment, and a connector holder engaged with the substrate, where the connector holder defines an engagement feature that is selectively engageable with and that selectively retains the connector of the fiber array unit, where the fiber array unit, the substrate, and the connector holder can be exposed to temperatures of more than 220 degrees without causing the lateral alignment to change more than 1.0 micrometer.

In yet another embodiment, an optoelectronic package assembly includes a fiber array unit including a connector and optical fibers coupled to the connector, a substrate including optical waveguides that are optically coupled to the optical fibers, where the optical waveguides and the optical fibers have a lateral alignment, an optoelectronic chip optically coupled to the optical waveguides, where the optoelectronic chip is optically coupled to the optical fibers through the optical waveguides of the substrate, and an electronic chip electrically coupled to the optoelectronic chip, where the fiber array unit, the substrate, and the optoelectronic chip can be exposed to temperatures of more than 220 degrees Celsius without causing the lateral alignment to change more than 1.0 micrometer.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate embodiments, and together with the description serve to explain principles and operation of the various embodiments.

BRIEF DESCRIPTION OF THE DRAWINGS

FIG. 1 schematically depicts a side view of an optoelectronic package assembly, according to one or more embodiments described and depicted herein;

DETAILED DESCRIPTION

Figure 2B:
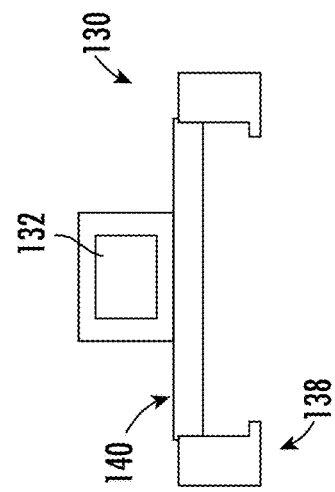
FIG. 2B schematically depicts a front view of the connector holder of FIG. 2A, according to one or more embodiments described and depicted herein.

Embodiments described herein are generally directed to optoelectronic package assemblies including a fiber array unit and a substrate including optical waveguides coupled to the fiber array unit. Some embodiments further include an optoelectronic chip and an electronic chip. The components of the optoelectronic package assembly are dimensionally stable at temperatures exceeding 220 degrees Celsius, such that the components of the optoelectronic package can endure a solder reflow process without any meaningful effect on a previously-established alignment of the fiber array unit relative to the optical waveguides of the substrate. By enduring a solder reflow process, accurate positioning of the fiber array unit relative to the substrate and the optoelectronic chip can be confirmed before the optoelectronic chip is soldered to a base substrate of the optoelectronic package assembly. Further, in some embodiments, a holder retains a connector of the fiber array unit, forming a module that can be picked and placed on the base substrate in an automated process. These and other embodiments of optoelectronic package assemblies are disclosed in greater detail herein with reference to the appended figures.

Referring initially to FIG. 1, a side view of an optoelectronic package assembly 100 is schematically depicted. The optoelectronic package assembly 100 generally includes a fiber array unit 110, a substrate 120, an optoelectronic chip 150, and an electronic chip 206. The fiber array unit 110 generally includes a connector 114 and optical fibers 112 coupled to a guide block 116. In embodiments, the optical fibers 112 are formed from materials that are dimensionally stable at comparatively high temperatures, such as glass, and may include portions with a polyamide coating or the like. The optical fibers 112 each include a core and a cladding. In some embodiments, the cladding may be comparatively thin to provide an outside diameter of less than 125 micrometers and to allow for fiber bending, thereby allowing the fiber array unit 110 to fit within a compact optoelectronic package assembly 100. In some embodiments, the cladding diameter may be less than 80 micrometers. In some embodiments, the cladding diameter may be less than 50 micrometers. In some embodiments, the optical fibers 112 may be un-coated, and may include, for example, double crucible drawn fibers with internal and external glass layers having different melting points.

In embodiments, the connector 114 can include any suitable optical connector, and may include features from one or more different types of connectors, such as MT type ferrules from MPO-type connectors (e.g., according to TIA/EIA_61754-7-1:2014) or the like. In some embodiments, the connector 114 may include axial latching and locking features that allow the connector 114 to be mechanically coupled to or inserted within features of the optoelectronic package assembly 100, as described in greater detail herein. In some embodiments, the connector 114 may include an adapter such that external connectors may be coupled to the connector 114, as described in greater detail herein. In embodiments, the connector 114 may be formed from a polymer, a thermoset plastic or the like.

As mentioned above, the fiber array unit 110 further includes a guide block 116 coupled to the optical fibers 112. In embodiments, the optical fibers 112 terminate at the guide block 116, and the guide block 116 may arrange the optical fibers 112 such that the optical fibers 112 may be optically coupled to another component, such as optical waveguides 122 on the substrate 120. In some embodiments, the guide block 116 may define v-grooves in which the optical fibers 112 are positioned; however, it is within the scope of the present disclosure that the guide block 116 may include any suitable construction to terminate the optical fibers 112. In some embodiments, the guide block 116 may include an array block that allows evanescent or vertical grating coupling to the optical fibers 112. The guide block 116 may be formed from silica-based glass, or the like.

The optoelectronic chip 150 and the electronic chip 206 are electrically coupled to one another. For example, in the embodiment depicted in FIG. 1, the electronic chip 206 and the optoelectronic chip 150 are coupled to a base substrate 200, and the base substrate 200 may include one or more traces (not shown) that electrically couple the electronic chip 206 to the optoelectronic chip 150. In some embodiments, the electronic chip 206 and/or the optoelectronic chip 150 may be coupled to the base substrate 200 through solder 10.

The electronic chip 206 may include an integrated circuit, for example, an application specific integrated circuit (ASIC), or the like. The optoelectronic chip 150 generally includes an optical source 152 that is structurally configured to emit an electromagnetic signal (e.g., an optical signal). The optical source 152 may include any suitable device for emitting an optical signal, and may include for example and without limitation, a laser source or the like. In embodiments, the optoelectronic chip 150 may be an optoelectronic transceiver or the like that is structurally configured to send and/or receive optical signals and to send and/or receive electrical signals. For example, in some embodiments, the optoelectronic chip 150 receives an optical signal and transmits a corresponding electrical signal to the electronic chip 206. Similarly, the optoelectronic chip 150, in some embodiments, can receive an electrical signal from the electronic chip 206 and transmit a corresponding optical signal via the optical source 152.

Figure 2A:
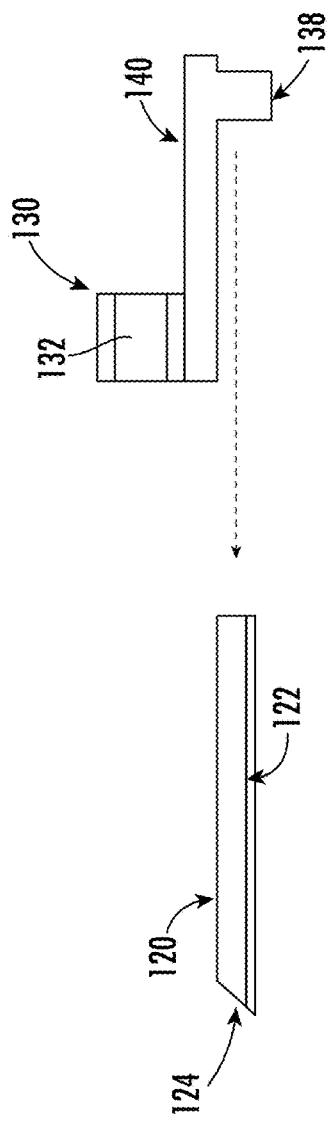
FIG. 2A schematically depicts a side view of a connector holder being positioned over a substrate of the optoelectronic package assembly of FIG. 1, according to one or more embodiments described and depicted herein.

Referring to FIG. 2A, a side view of the substrate 120 is schematically depicted. The substrate 120 comprises a photonic integrated circuit (PIC) including a total internal reflection (TIR) bevel 124. Thus, the substrate 120 may comprise photonic circuitry to generate, modulate, detect or process light in any suitable fashion. The substrate 120 also includes optical waveguides 122. In some embodiments, the optical waveguides 122 are planar waveguides extending through the substrate 120. As described in greater detail herein, the optical signals may be transmitted through the optical waveguides 122 of the substrate 120. While the embodiment depicted in FIG. 2A shows one optical waveguide 122 positioned at a bottom surface of the substrate 120, it should be understood that this is merely an example.

Referring to FIGS. 2A and 2B, the substrate 120 is depicted with a connector holder 130. As described in greater detail herein, the connector holder 130 is utilized to hold the connector 114 (FIG. 1) during an assembly process. The connector holder 130 generally defines an engagement feature 132 that is selectively engagable with, and that selectively retains the connector 114. In the embodiment depicted in FIGS. 2A and 2B, the engagement feature 132 comprises an aperture through which the connector 114 (FIG. 1) can be selectively inserted. In embodiments, the connector holder 130 further includes a carrier 140 and a guide 138. The engagement feature 132 and the guide 138 are generally positioned on the carrier 140. As shown in FIGS. 2A and 2B, the guide 138 may be engaged with the substrate 120 to selectively couple the connector holder 130 to the substrate 120. For example, in the embodiment depicted in FIGS. 2A and 2B, the guide 138 is sized to fit around at least a portion of the substrate 120 and generally defines a c-shape. In embodiments, the connector holder 130 is formed from a temperature-resistant polymer, a thermoset plastic or the like.

Figure 3A:
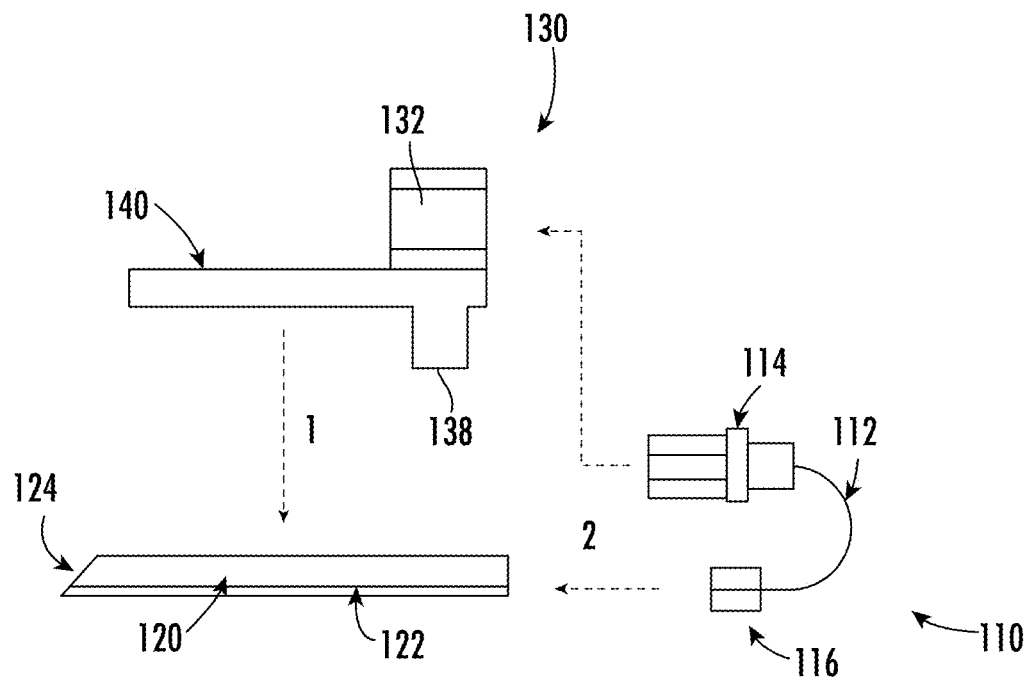
FIG. 3A schematically depicts a side view of the substrate and the connector holder of FIG. 2A and a fiber array unit, according to one or more embodiments described and depicted herein.
Figure 3B:
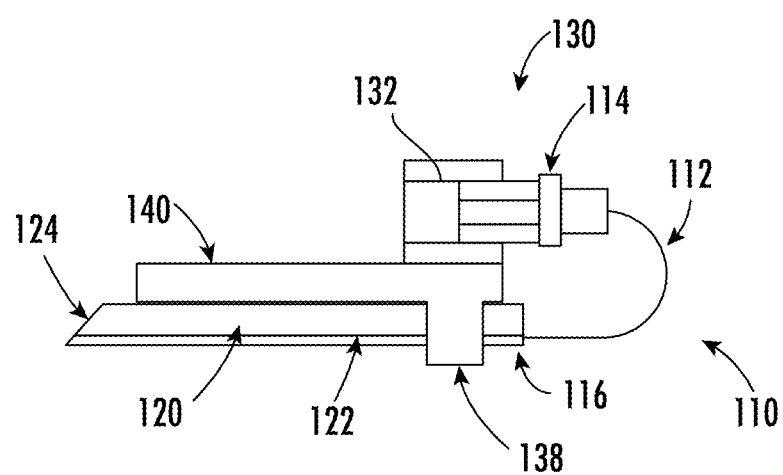
FIG. 3B schematically depicts a side view of the connector holder and the fiber array unit engaged with the substrate of FIG. 3A, according to one or more embodiments described and depicted herein.

Referring to FIGS. 3A and 3B, a side view of the connector holder 130 is depicted as being engaged with the substrate 120. As shown in FIGS. 3A and 3B, the guide 138 of the connector holder 130 may engage the substrate 120 to selectively couple the connector holder 130 to the substrate 120.

The fiber array unit 110 is also coupled to the substrate 120. In particular, the guide block 116 is coupled to an end of the substrate 120, and the optical fibers 112 are optically coupled to the optical waveguides 122. In embodiments, the guide block 116 may be coupled to the substrate 120 in any suitable manner, for example and without limitation via adhesives or the like. In one embodiment, the guide block 116 is coupled to the substrate 120 with UV25 adhesive available from Masterbond of Hackensack, N.J. During the assembly process, the connector 114 is insertable within the engagement feature 132 of the connector holder 130, as shown in FIG. 3B. By engaging the connector 114 with the engagement feature 132, the position of the connector 114 may be retained, such that the substrate 120 and the fiber array unit 110 may be moved, such as by a "pick and place" robot without placing stresses on the optical fibers 112. Furthermore, by retaining the position of the connector 114, stress at the interface between the guide block 116 and the substrate 120 resulting from movement of the guide block 116 via movement of the optical fibers 112 and the connector 114 can be reduced.

Figure 4A:
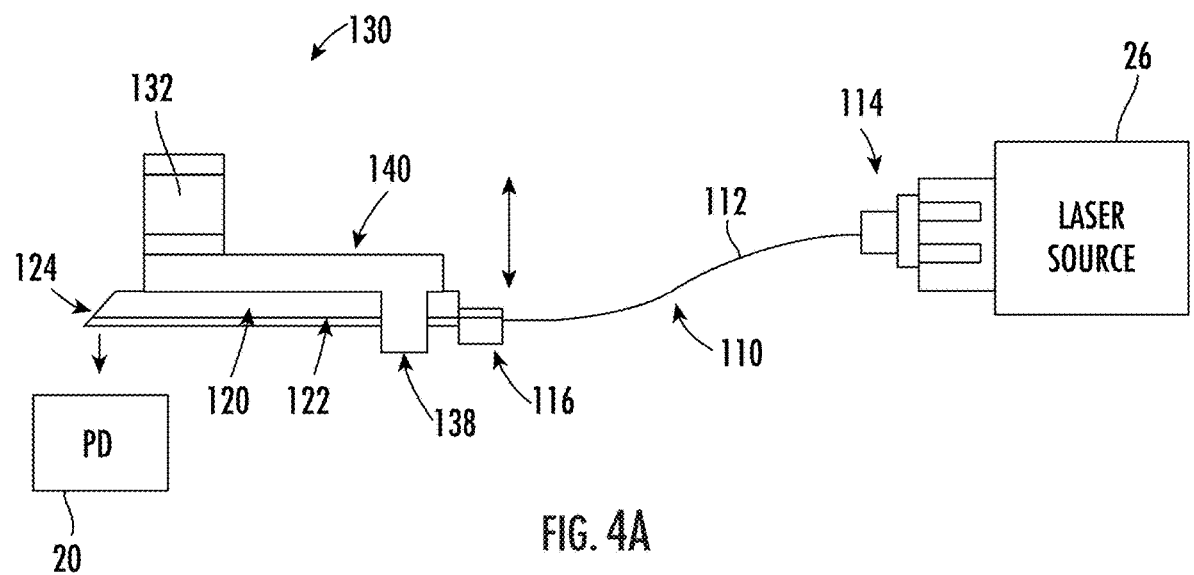
FIG. 4A schematically depicts a side view of the connector holder, the fiber array unit, and the substrate of FIG. 3B positioned over a photodetector, according to one or more embodiments described and depicted herein.

Referring to FIG. 4A, a schematic side view of the substrate 120 is depicted with the fiber array unit 110. Prior to coupling the guide block 116 to the substrate 120, the optical fibers 112 are aligned with the optical waveguides 122. For example, in the embodiment depicted in FIG. 4A, the connector 114 is optically coupled to an electromagnetic source 26 that emits electromagnetic energy, such as a laser source or the like. In embodiments, a photo detector 20 is positioned to receive signals emitted from the electromagnetic source 26. In particular, in the embodiment depicted in FIG. 4A, the photo detector 20 is optically coupled to the optical waveguides 122, such that signals emitted from the electromagnetic source 26 are transmitted through the connector 114, through the optical fibers 112, through the optical waveguides 122, and are received at the photo detector 20. Misalignment between the optical fibers 112 and the optical waveguides 122 contributes to signal loss evaluated between the electromagnetic source 26 and the photo detector 20. Accordingly, before coupling the guide block 116 to the substrate 120, the guide block 116 and the optical fibers 112 are moved with respect to the optical waveguides 122 to minimize detected signal loss detected at the photo detector 20 to align the optical fibers 112 with the optical waveguides 122.

Figure 4B:
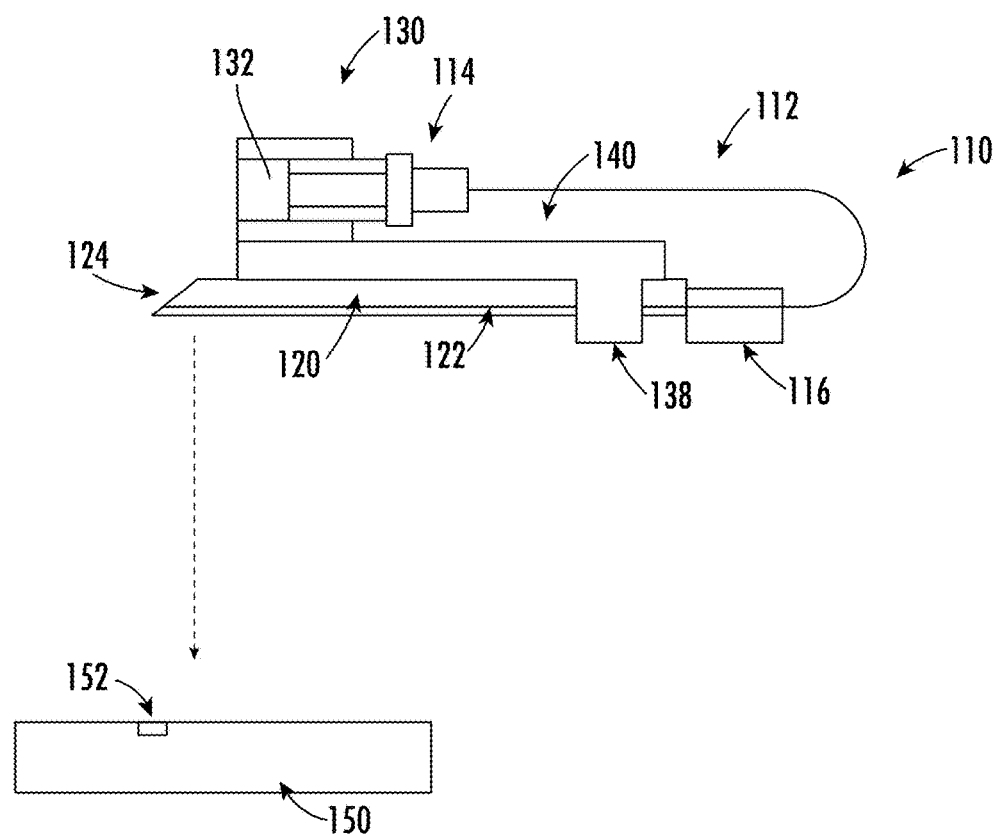
FIG. 4B schematically depicts a side view of the connector holder, the fiber array unit, the substrate positioned over an optoelectronic chip, according to one or more embodiments described and depicted herein.
Figure 4C:
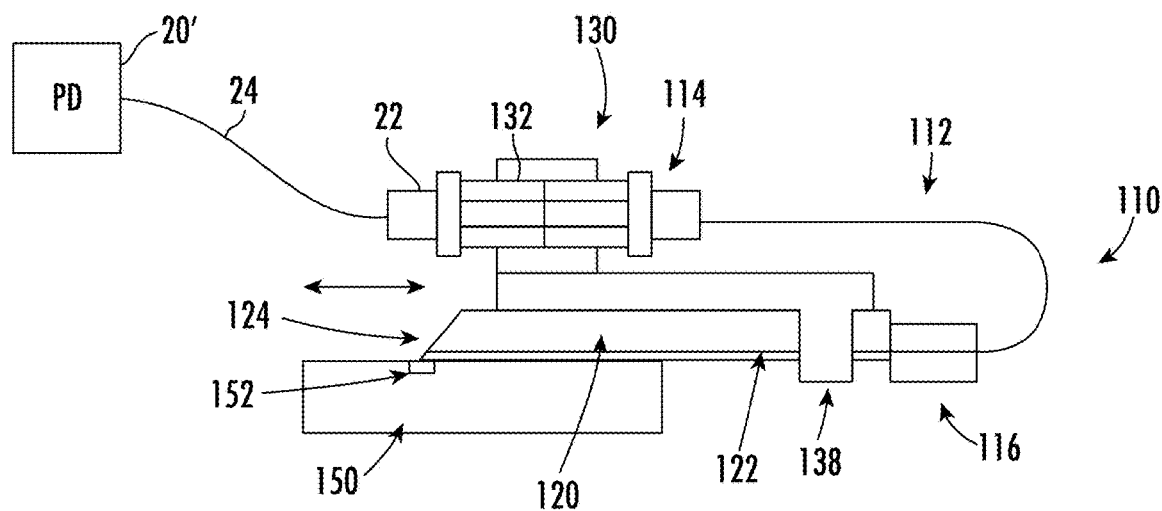
FIG. 4C schematically depicts aside view of the connector holder, the fiber array unit, the substrate engaged with the optoelectronic chip of FIG. 4B, according to one or more embodiments described and depicted herein.

Referring to FIGS. 4B and 4C, a side view of the substrate 120 is depicted being engaged with and aligned with the optoelectronic chip 150. Before coupling the substrate 120 to the optoelectronic chip 150, the optical waveguides 122 may be aligned with the optical source 152 of the optoelectronic chip 150. For example and referring particularly to FIG. 4C, in some embodiments, the connector 114 of the fiber array unit 110 is optically coupled to an external connector 22, a fiber 24, and another photo detector 20'. In embodiments, signals emitted from the optical source 152 are transmitted through the optical waveguides 122 of the substrate 120, through the optical fibers 112, through the connector 114, through the external connector 22, through the fibers 24, and are received at the photo detector 20'. Similar to the alignment process described above and depicted in FIG. 4A, misalignment between the optical source 152 and the optical waveguides 122 may result in signal loss evaluated between the optical source 152 and the photo detector 20'. Accordingly, before coupling the substrate 120 and the optoelectronic chip 150, the optical waveguides 122 can be moved with respect to optical source 152 to minimize detected signal loss detected at the photo detector 20' to align the optical waveguides 122 with the optical source 152. Once the optical waveguides 122 are aligned with the optical source 152, the substrate 120 is mechanically coupled to the optoelectronic chip 150. The substrate 120 and the optical waveguides 122 may be coupled to the optoelectronic chip 150 through an adhesive or the like. In one embodiment, the substrate 120 is coupled to the optoelectronic chip 150 with UV25 adhesive available from Masterbond of Hackensack, N.J.

Figure 5:
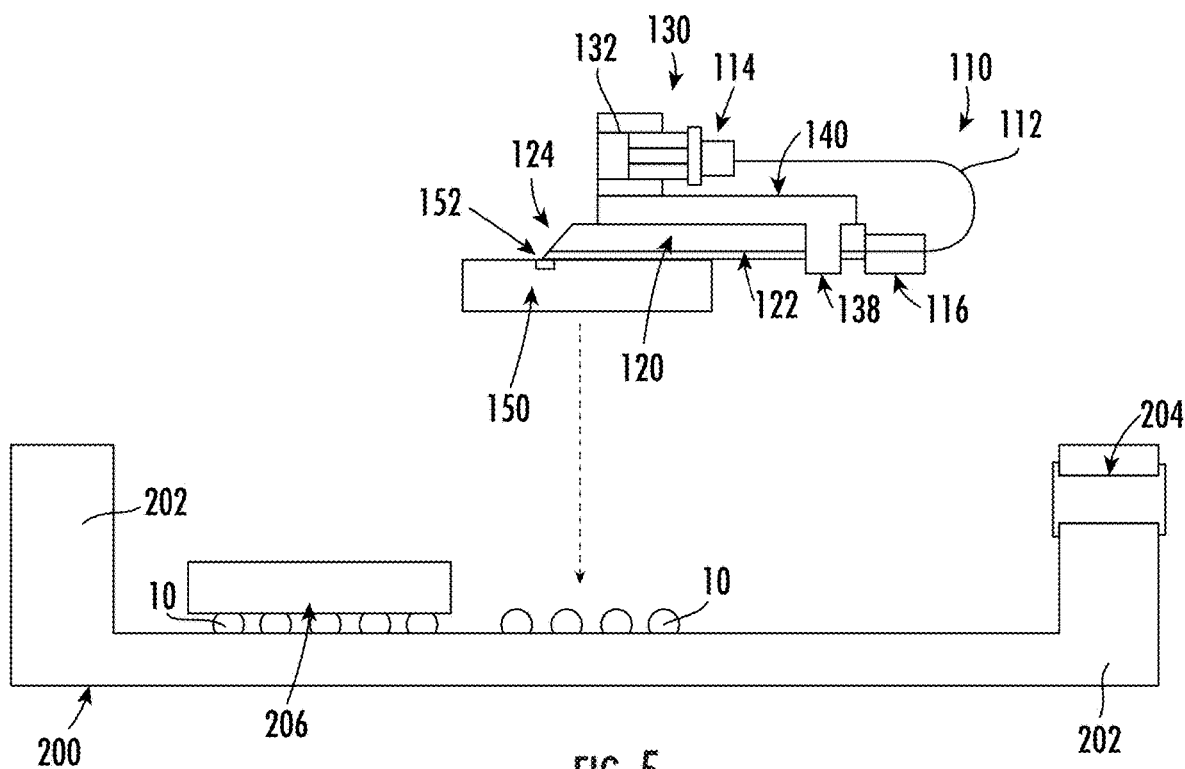
FIG. 5 schematically depicts a side view of the connector holder, the fiber array unit, the substrate, and the optoelectronic chip of FIG. 4C positioned over a base substrate of the optoelectronic package assembly of FIG. 1, according to one or more embodiments described and depicted herein.
Figure 6:
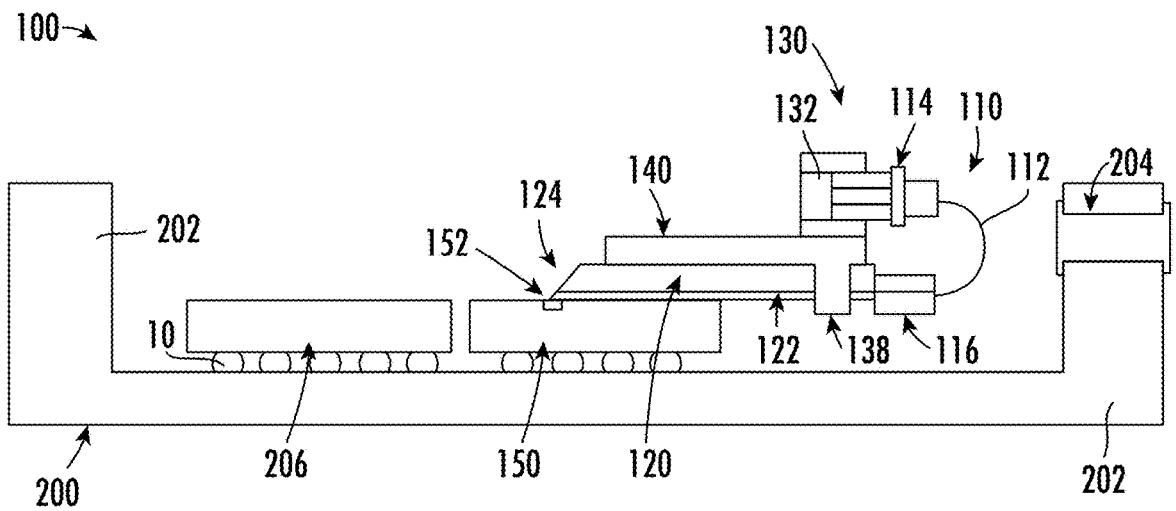
FIG. 6 schematically depicts a side view of the connector holder, the fiber array unit, the substrate, and the optoelectronic chip of FIG. 5 coupled to the base substrate of FIG. 5, according to one or more embodiments described and depicted herein.

Once the substrate 120 and the optical waveguides 122 are coupled to the optoelectronic chip 150, the substrate 120 and the optoelectronic chip 150 are coupled to the base substrate 200. For example and referring to FIGS. 5 and 6, the optoelectronic chip 150 may be positioned on solder 10 to couple the optoelectronic chip 150 to the base substrate 200. Similarly, the electronic chip 206 may be positioned on solder 10 to couple the electronic chip 206 to the base substrate 200. As noted above, the electronic chip 206 and the optoelectronic chip 150 may be indirectly coupled to one another through the base substrate 200 and the solder 10.

With both the electronic chip 206 and the optoelectronic chip 150 positioned on the solder 10, the electronic chip 206 and the optoelectronic chip 150 are coupled to the base substrate 200, for example through a solder reflow process (i.e., heating and subsequent passive or active cooling of solder). As one example, a solder reflow process may include heating the optoelectronic package assembly 100 at a temperature greater than 220 degrees Celsius for 40 seconds or more. In some embodiments, the solder reflow process may include heating the optoelectronic package assembly 100 at a temperature greater than 220 degrees Celsius for between about 40 seconds and 120 seconds. In some embodiments, the solder reflow process may include heating the optoelectronic package assembly 100 at a temperature between 240 degrees Celsius and about 270 degrees Celsius for between about 40 seconds and about 120 seconds. As mentioned above, the fiber array unit 110, the substrate 120 and the optical waveguide 122, the optoelectronic chip 150, and the connector holder 130 are formed from materials that are dimensionally stable at temperatures and durations of the solder reflow processes described herein.

Moreover, as described herein, the substrate 120 may be coupled to the optoelectronic chip 150 by an adhesive, and the guide block 116 may be coupled to the substrate 120 by an adhesive. In these embodiments, the adhesive selected is dimensionally stable at temperatures and durations of the solder reflow processes described herein. As referred to herein, the phrase "dimensionally stable" means that components of the optoelectronic package assembly 100 are formed from materials that do not plastically or elastically deform during a solder reflow process as described above in a manner that would impact alignment of one or more components of the optoelectronic package assembly 100. As one example, lateral alignment between the optical fibers 112 of the fiber array unit 110 and the optical waveguides 122 changes less than 1.0 micrometer after a solder reflow process (e.g., exposure to temperatures exceeding 220 degrees Celsius, temperatures between 240 degrees Celsius and 270 degrees Celsius, inclusive of the endpoints, etc., and then subsequent cooling). As another example, lateral alignment between the optical fibers 112 of the fiber array unit 110 and the optical waveguides 122 changes less than 0.7 micrometers during the solder reflow process (e.g., exposure to temperatures exceeding 220 degrees Celsius, temperatures between 240 degrees Celsius and 270 degrees Celsius, inclusive of the endpoints, etc., and then subsequent cooling). As another example, lateral alignment between the optical fibers 112 of the fiber array unit 110 and the optical waveguides 122 changes less than 0.5 micrometers during the solder reflow process (e.g., exposure to temperatures exceeding 220 degrees Celsius, temperatures between 240 degrees Celsius and 270 degrees Celsius, inclusive of the endpoints, etc., and then subsequent cooling). As another example, lateral alignment between the optical fibers 112 of the fiber array unit 110 and the optical waveguides 122 changes less than 0.2 micrometers during the solder reflow process (e.g., exposure to temperatures exceeding 220 degrees Celsius, temperatures between 240 degrees Celsius and 270 degrees Celsius, inclusive of the endpoints, etc., and then subsequent cooling).

Evaluated another way, optical loss between the optical fibers 112 of the fiber array unit 110 and the optical waveguides 122 changes less than 0.10 decibels during the solder reflow process (e.g., exposure to temperatures exceeding 220 degrees Celsius, temperatures between 240 degrees Celsius and 270 degrees Celsius, inclusive of the endpoints, etc., and then subsequent cooling). As another example, optical loss between the optical fibers 112 of the fiber array unit 110 and the optical waveguides 122 changes less than 0.07 decibels during the solder reflow process (e.g., exposure to temperatures exceeding 220 degrees Celsius, temperatures between 240 degrees Celsius and 270 degrees Celsius, inclusive of the endpoints, etc., and then subsequent cooling). As another example, optical loss between the optical fibers 112 of the fiber array unit 110 and the optical waveguides 122 changes less than 0.05 decibels during the solder reflow process (e.g., exposure to temperatures exceeding 220 degrees Celsius, temperatures between 240 degrees Celsius and 270 degrees Celsius, inclusive of the endpoints, etc., and then subsequent cooling). In this way, the components of the optoelectronic package assembly 100 may endure a solder reflow process (e.g., exposure to temperatures exceeding 220 degrees Celsius, temperatures between 240 degrees Celsius and 270 degrees Celsius, inclusive of the endpoints, etc., and then subsequent cooling) without degrading the operation of the optoelectronic package assembly 100.

By forming the optoelectronic package assembly 100 of components that can endure a solder reflow process, the assembly of the optoelectronic package assembly 100 may be simplified, thereby reducing manufacturing costs. In particular, because the components of the optoelectronic package assembly 100 can endure a solder reflow process, it is not necessary to remove any of the components prior to the solder reflow process and to re-attach the components after the solder reflow process. Accordingly, the steps required to manufacture the optoelectronic package assembly 100 may be reduced, thereby reducing manufacturing costs. Moreover, forces applied to the components of the optoelectronic package assembly 100 during the manufacturing process, e.g., through the removal and re-attachment of components of the optoelectronic package assembly 100, may be reduced, which may reduce the breakage of components of the optoelectronic package assembly 100.

Moreover, as described above, optical components of the optoelectronic package assembly 100 (e.g., the fiber array unit 110, the substrate 120, and the optoelectronic chip 150) can be aligned with one another before the optoelectronic chip 150 is soldered to the base substrate 200. Accordingly, defects and/or misalignment of the components with optical elements (e.g., the fiber array unit 110, the substrate 120, and the optoelectronic chip 150) can be detected early in the assembly process, thereby reducing the amount of components discarded in the case of defects or misalignment. For example, if the optoelectronic chip 150 is coupled to the base substrate 200 before defects and/or misalignment of the components with optical elements (e.g., the fiber array unit 110, the substrate 120, and the optoelectronic chip 150) are detected, such as through the photo detectors 20, 20' (FIGS. 4A, 4C), it may be difficult or impossible to replace or align the defective components, and in some instances, it may be necessary to discard the entire optoelectronic package assembly 100. By contrast, by detecting defects and alignment of the components with optical elements (e.g., the fiber array unit 110, the substrate 120, and the optoelectronic chip 150) before coupling the optoelectronic chip 150 to the base substrate 200, the amount of components of the optoelectronic package assembly 100 required to be discarded in the case of a defect or misalignment may be minimized, thereby reducing manufacturing costs.

Further, by assembling the substrate 120 and the fiber array unit 110 to the optoelectronic chip 150 before coupling the optoelectronic chip 150 to the base substrate 200, the substrate 120 and the fiber array unit 110 to the optoelectronic chip 150 may be installed to the base substrate 200 in an automated "pick and place" process. By automating the assembly of the optoelectronic package assembly 100, manufacturing costs may be reduced as compared to conventional assembly processes.

In some embodiments, the connector holder 130 thermally insulates the connector 114 during the solder reflow process. For example, in the embodiment depicted in FIGS. 6 and 7, the engagement feature 132 of the connector holder 130 defines an aperture through which the connector 114 is inserted. With the connector 114 at least partially inserted within the aperture of the connector holder 130, the connector holder 130 may at least partially thermally insulate the connector 114 during the solder reflow process, which may reduce degradation of the connector 114 resulting from the solder reflow process.

Figure 7:
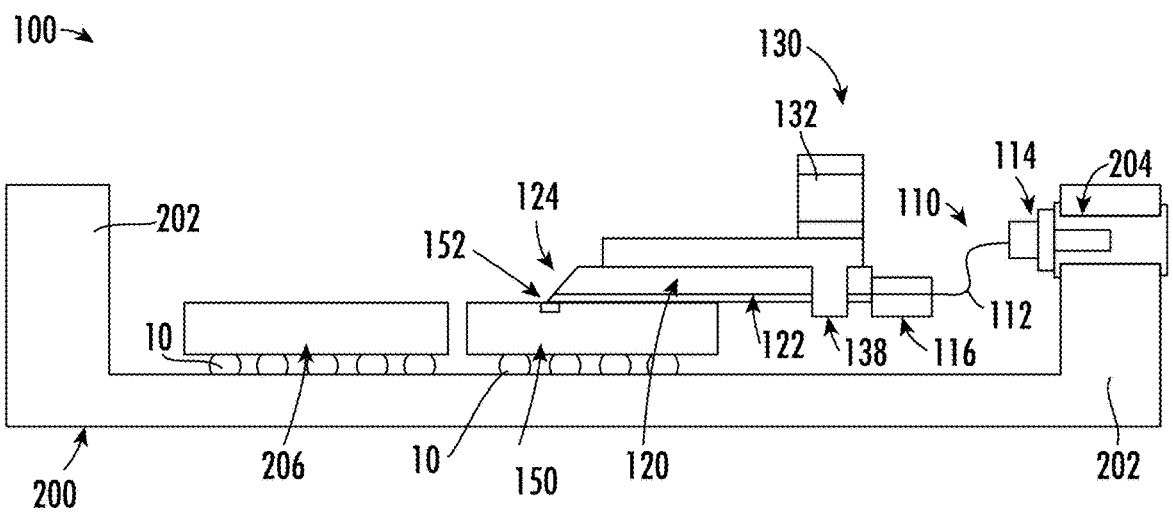
FIG. 7 schematically depicts a side view of the connector holder, the fiber array unit, the substrate, and the optoelectronic chip of FIG. 6 with a connector of the fiber array unit inserted at least partially within a module wall, according to one or more embodiments described and depicted herein.

As shown in in FIG. 7, in embodiments, the optoelectronic package assembly 100 includes one or more module walls 202 extending upward from the base substrate 200. One or more of the module walls 202, in embodiments, include an adapter 204 that is structurally configured to receive the connector 114. In particular, the connector 114 may be positioned at least partially within the adapter 204 of the module wall 202 so that external components, such as external connectors or the like, can be optically coupled to the connector 114.

Referring again to FIG. 1, in some embodiments, a lid 208 is positioned over the module walls 202 to at least partially encapsulate the electronic chip 206, the optoelectronic chip 150, the substrate 120 and the optical waveguides 122, and the fiber array unit 110. In some embodiments and as shown in FIG. 1, the connector holder 130 (FIG. 7) may be removed from the substrate 120 before the lid 208 is positioned over the module walls 202. In some embodiments, the lid 208 may include a heat sink or the like that dissipates thermal energy from the optoelectronic package assembly 100.

In the embodiment depicted in FIG. 1, the base substrate 200 is coupled to a printed circuit board (PCB) 210 through solder 10. In embodiments, the electronic chip 206 and/or the optoelectronic chip 150 are electrically coupled to the PCB 210 through the base substrate 200 and the solder 10 positioned between the PCB 210 and the base substrate 200.

In some embodiments, the base substrate 200 is coupled to the PCB 210 in the same solder reflow process in which the electronic chip 206 and the optoelectronic chip 150 are coupled to the base substrate 200. In some embodiments, the base substrate 200 is coupled to the PCB 210 in a separate process from the solder reflow process in which the electronic chip 206 and the optoelectronic chip 150 are coupled to the base substrate 200.

Figure 8A:
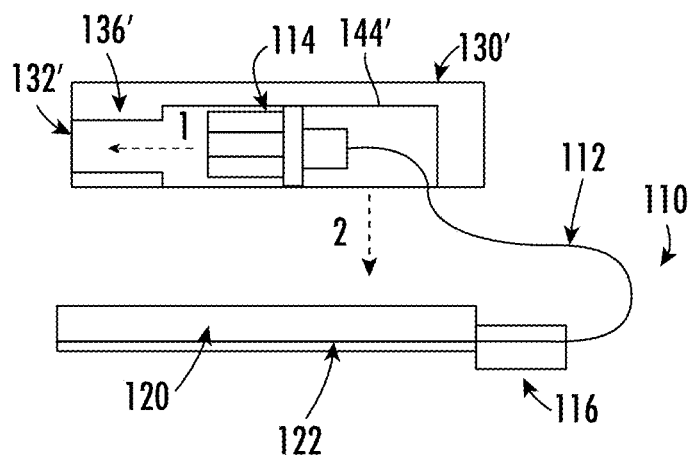
FIG. 8A schematically depicts a side view of another embodiment of a connector holder, according to one or more embodiments described and depicted herein.
Figure 8B:
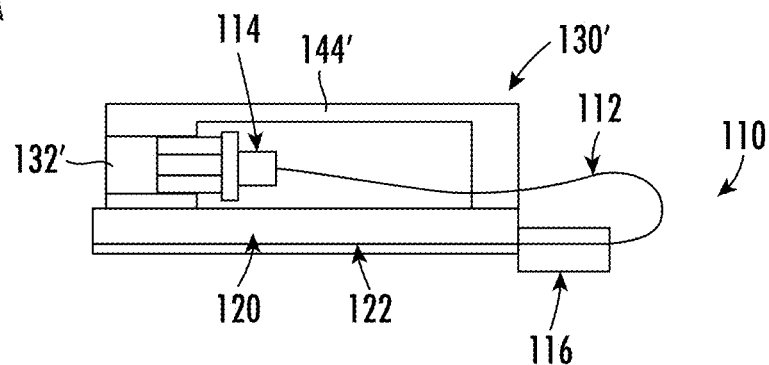
FIG. 8B schematically depicts a side view of the connector holder of FIG. 8A engaged with the substrate, according to one or more embodiments described and depicted herein.

Referring to FIGS. 8A and 8B, another embodiment of the connector holder 130' is schematically depicted. In the embodiment depicted in FIGS. 8A and 8B, the connector holder 130' generally defines a cover 144' that at least partially encapsulates the connector 114 of the fiber array unit 110. The cover 144' may assist in thermally insulating the connector 114 during the solder reflow process.

In the embodiment depicted in FIGS. 8A and 8B, the engagement feature 132' defines an aperture, and the connector 114 is insertable within the engagement feature 132' of the connector holder 130'. External components (e.g., the electromagnetic source 26 (FIG. 4A) and/or the external connector 22 (FIG. 4C)) can access the connector 114 through the engagement feature 132' and can be optically coupled to the connector 114 to assist in aligning the components of the optoelectronic package assembly 100, as described above. While in the embodiment depicted in FIGS. 8A and 8B the engagement feature 132' defines an aperture, in some embodiments, the cover 144' of the connector holder 130' may encapsulate the connector 114, such that the connector 114 is not accessible by external components (e.g., the electromagnetic source 26 (FIG. 4A) and/or the external connector 22 (FIG. 4C)). Furthermore, while in the embodiment depicted in FIGS. 8A and 8B the connector holder 130' retains the connector 114 in a horizontal position, it is within the scope of the present disclosure that connector holders described herein may engage and retain the connector in any suitable orientation.

Further, in the embodiment depicted in FIGS. 8A and 8B, the connector holder 130' does not include the guide 138 (FIG. 2B). In the embodiment depicted in FIGS. 8A and 8B, the connector holder 130' may be selectively coupled to the substrate 120 by an adhesive, such as a temporary adhesive that allows the connector holder 130' to be attached to and removable from the substrate 120.

Figure 9:
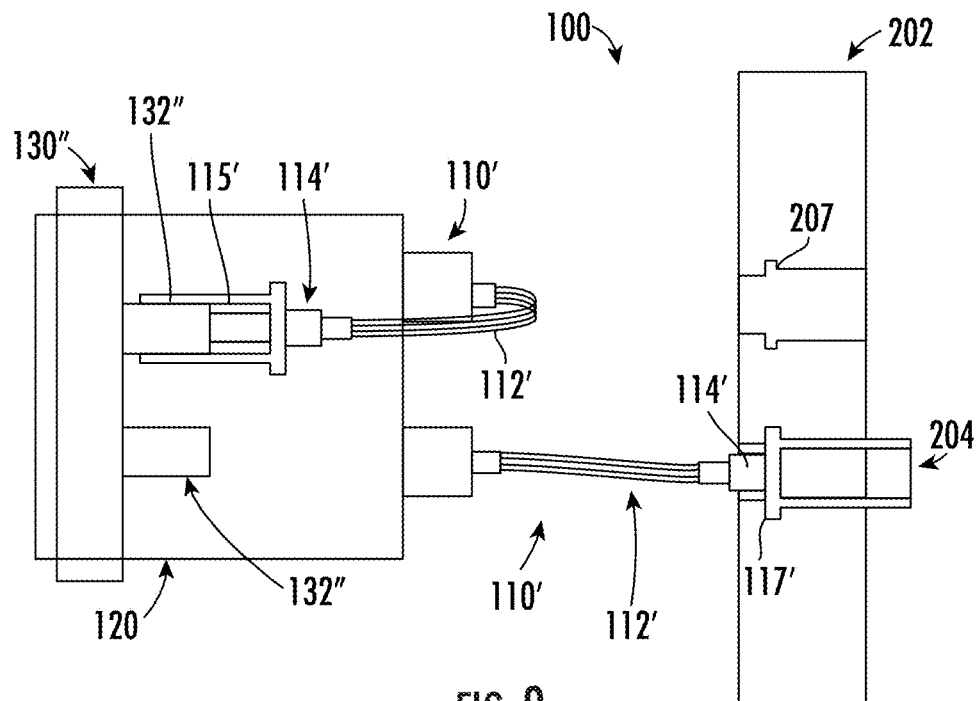
FIG. 9 schematically depicts a top view of another embodiment of a connector holder, according to one or more embodiments described and depicted herein.

Referring to FIG. 9, a top view of another embodiment of the connector holder 130" is schematically depicted. In the embodiment depicted in FIG. 9, the engagement feature 132" of the connector holder 130" comprises a post that is selectively engageable with the connector 114'. For example, in the embodiment depicted in FIG. 9, the connector 114' includes an adapter 115' that can slide over at least a portion of the post. In embodiments, the adapter 115' may receive external connectors to optically couple the external connectors to the connector 114'. In some embodiments, the adapter 115' may include an engagement member 117' that engages at least a portion of the module wall 202 so that the adapter 115' can be coupled to the module wall 202. For example, in the embodiment depicted in FIG. 9, the engagement member 117' is a flange that engages a recess 207 defined by the module wall 202 to couple the adapter 115' to the module wall 202.

Embodiments of the present disclosure are directed to optoelectronic package assemblies including a fiber array unit, a substrate including optical waveguides, an optoelectronic chip, and an electronic chip. The components of the optoelectronic package are dimensionally stable at temperatures exceeding 220 degrees Celsius, such that the components of the optoelectronic package can endure a solder reflow process. By enduring a solder reflow process, optical alignment of the fiber array unit with the substrate and the optoelectronic chip can be confirmed before the optoelectronic chip is soldered to a base substrate of the optoelectronic package assembly. Further, the fiber array unit may be coupled to substrate and the optoelectronic chip forming a module that can be picked and placed on the base substrate in an automated process.

As depicted in FIG. 9, in some embodiments, the connector holder 130" may engage and retain multiple connectors 114'. For example, in the embodiment depicted in FIG. 9, the connector holder 130" includes a pair of engagement features 132" that are configured to engage and retain a pair of connectors 114' side-by-side. While the embodiment depicted in FIG. 9 shows the engagement features 132" including side-by-side posts, it is within the scope of the present disclosure that connector holders including engagement features having apertures may also engage and retain connectors in a side-by-side orientation. Additionally, while the connector holder 130" is depicted as including two engagement features 132", it is within the scope of the present disclosure that connector holders described herein may include any suitable number of engagement features structurally configured to hold any suitable number of connectors. Furthermore, while the engagement features 132" are depicted as being in a side-by-side orientation, it is within the scope of the present disclosure that the engagement features 132" may also be oriented in a vertical orientation, rotated on edge and arranged side-by-side in a more compact arrangement, or stacked one on top of the other.

Figure 10:
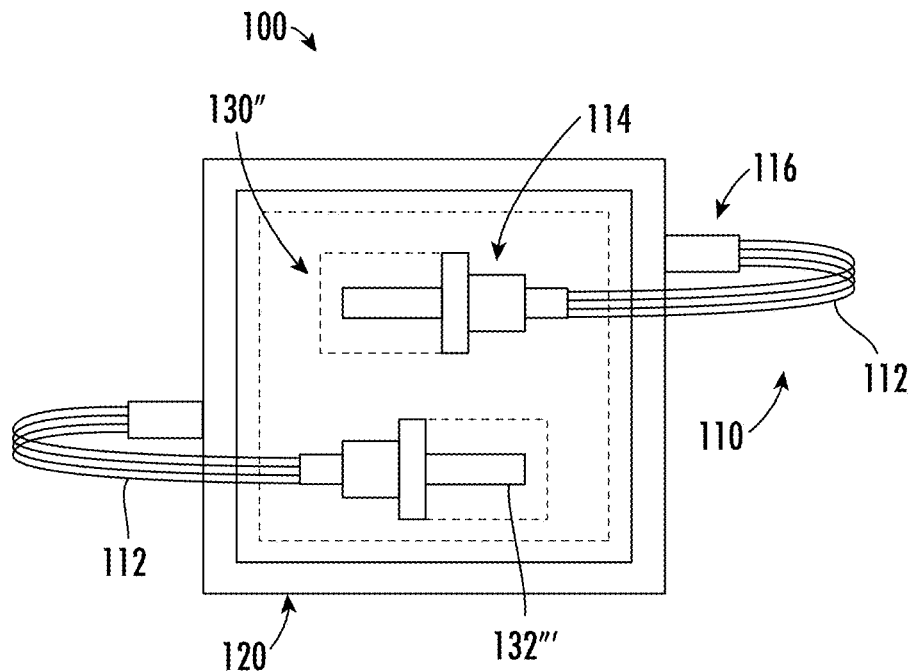
FIG. 10 schematically depicts a top view of another embodiment of a connector holder, according to one or more embodiments shown and described herein.
Figure 11:
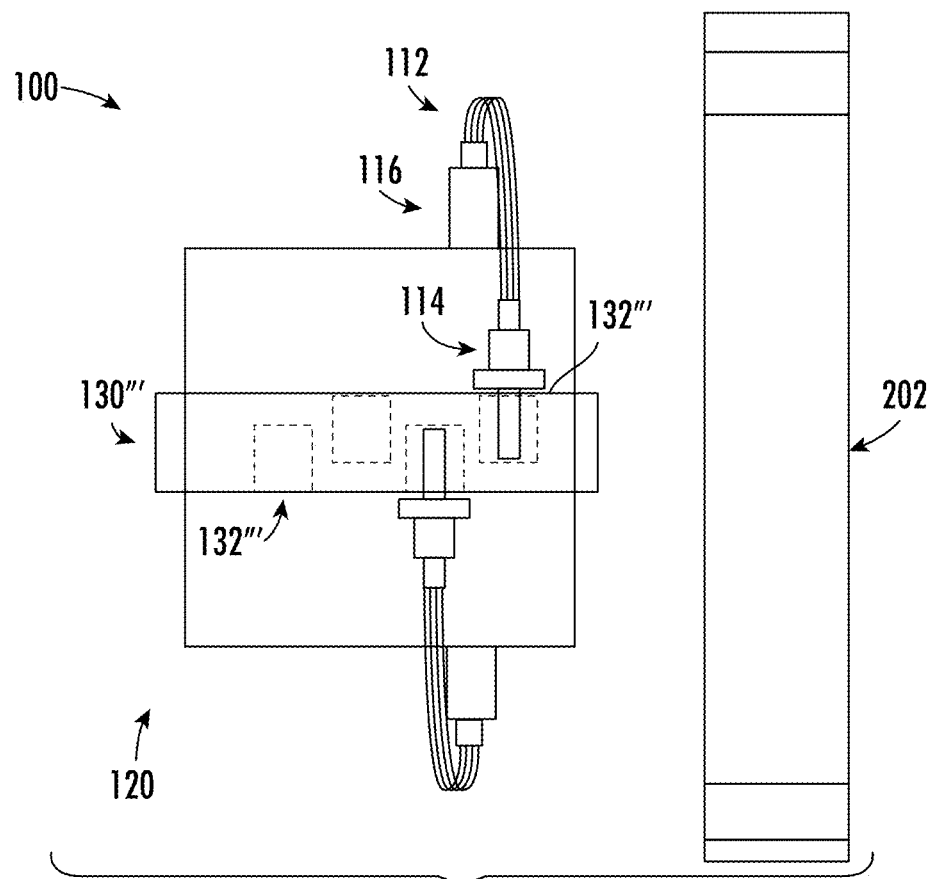
FIG. 11 schematically depicts a top view of another embodiment of a connector holder and a module wall of the optoelectronic package assembly, according to one or more embodiments shown and described herein.

Moreover, while in the embodiment depicted in FIG. 9 the engagement features 132" are oriented to face in the same direction, in embodiments, the engagement features 132" can be positioned in any suitable orientation. For example and referring to FIGS. 10 and 11, in some embodiments, the engagement features 132'" of the connector holder 130'" are oriented to face in opposing directions.

Figure 12:
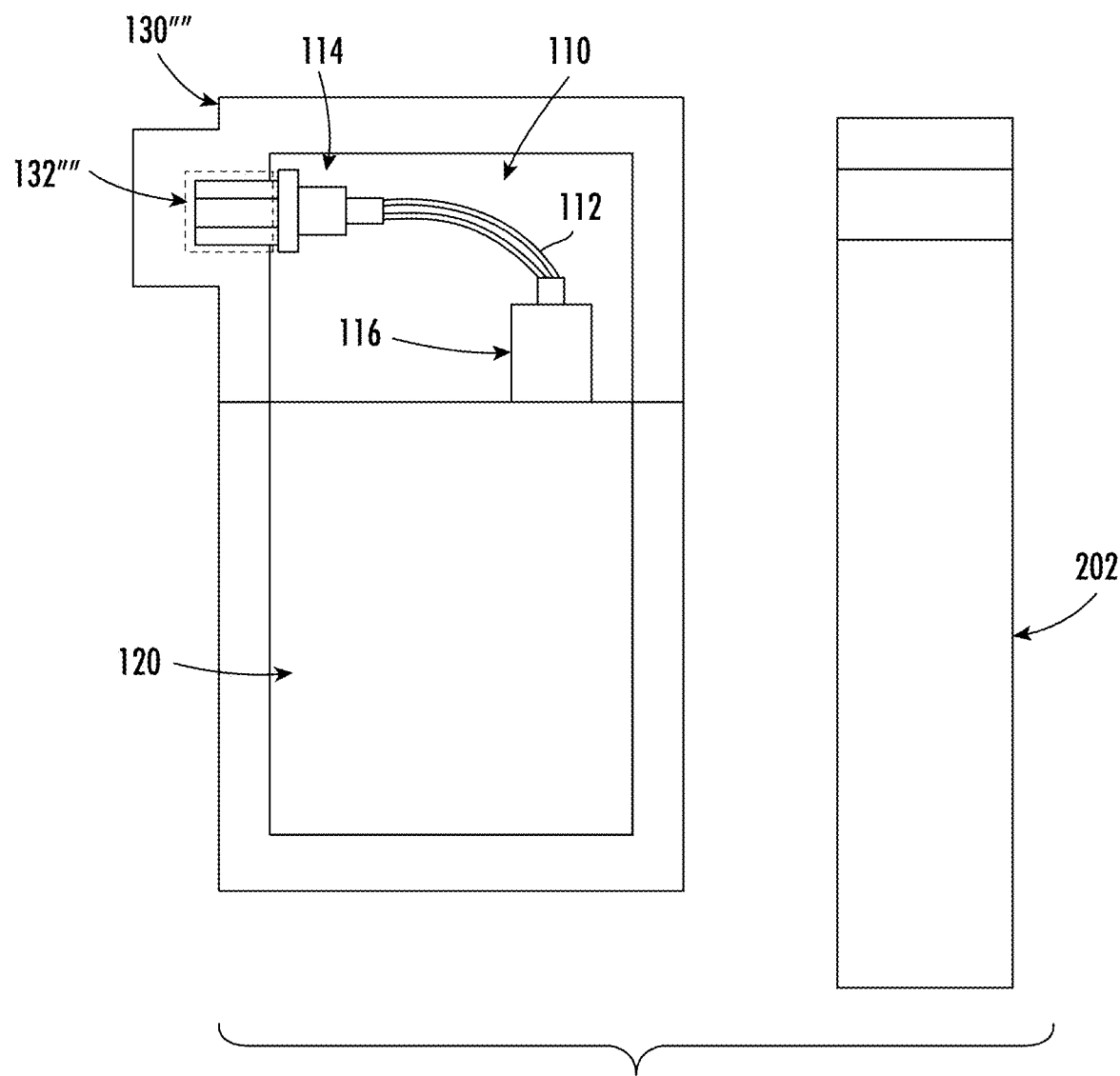
FIG. 12 schematically depicts a top view of another embodiment of a connector holder and a module wall of an optoelectronic package assembly, according to one or more embodiments shown and described herein.

Further, while embodiments described herein generally depict the connector holder 130'" positioned over the substrate 120, in some embodiments, the engagement features 132'" of the connector holder 130'" may be offset from the substrate 120. For example and referring to FIG. 12, in some embodiments, the connector holder 130"" and the engagement feature 132"" are offset from the substrate 120. Accordingly, in embodiments, connector holders and engagement features of the connector holders described herein may be positioned at different locations within the optoelectronic package assembly, which can allow the length of the optical fibers 112 to be selected to allow the connector 114 to reach the module wall 202 without requiring excess length of optical fiber 112.

Accordingly, embodiments described herein are directed to optoelectronic package assemblies including a fiber array unit and a substrate including optical waveguides coupled to the fiber array unit. Some embodiments further include an optoelectronic chip and an electronic chip. The components of the optoelectronic package assembly are dimensionally stable at temperatures exceeding 220 degrees Celsius, such that the components of the optoelectronic package can endure a solder reflow process. By enduring a solder reflow process, optical alignment of the fiber array unit with the substrate and the optoelectronic chip can be confirmed before the optoelectronic chip is soldered to a base substrate of the optoelectronic package assembly. Further, in some embodiments, a holder retains a connector of the fiber array unit forming a module that can be picked and placed on the base substrate in an automated process.

Recitations herein of a component of the present disclosure being "structurally configured" in a particular way, to embody a particular property, or to function in a particular manner, are structural recitations, as opposed to recitations of intended use. More specifically, the references herein to the manner in which a component is "structurally configured" denotes an existing physical condition of the component and, as such, is to be taken as a definite recitation of the structural characteristics of the component.

For the purposes of describing and defining the present invention, it is noted that the terms "substantially" and "about" are utilized herein to represent the inherent degree of uncertainty that may be attributed to any quantitative comparison, value, measurement, or other representation. The terms "substantially" and "about" are also utilized herein to represent the degree by which a quantitative representation may vary from a stated reference without resulting in a change in the basic function of the subject matter at issue.

Having described the subject matter of the present disclosure in detail and by reference to specific embodiments thereof, it is noted that the various details disclosed herein should not be taken to imply that these details relate to elements that are essential components of the various embodiments described herein, even in cases where a particular element is illustrated in each of the drawings that accompany the present description. Further, it will be apparent that modifications and variations are possible without departing from the scope of the present disclosure, including, but not limited to, embodiments defined in the appended claims. More specifically, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method for assembling an optoelectronic package assembly, the method comprising:
engaging a connector holder with a substrate, the connector holder defining an engagement feature and the substrate comprising optical waveguides;
engaging a connector of a fiber array unit with the engagement feature of the connector holder, wherein the engagement feature retains the connector, and wherein the fiber array unit further comprises optical fibers coupled to the connector;
optically coupling the optical fibers of the fiber array unit to the optical waveguides of the substrate;
heating the connector holder, the fiber array unit, the substrate, and a solder positioned between the substrate and a base substrate, wherein the heating is sufficient to melt the solder; and
cooling the solder to couple the substrate to the base substrate.

2. The method of claim 1, wherein:
heating the connector holder, the fiber array unit, the substrate, and the solder comprises exposing the connector holder, the fiber array unit, the substrate, and the solder to temperatures greater than 220 degrees Celsius.

3. The method of claim 1, wherein:
heating the connector holder, the fiber array unit, the substrate, and the solder comprises exposing the connector holder, the fiber array unit, the substrate, and the solder to temperatures between about 240 degrees Celsius and about 270 degrees Celsius.

4. The method of claim 1, wherein:
heating the connector holder, the fiber array unit, the substrate, and the solder comprises exposing the connector holder, the fiber array unit, the substrate, and the solder to temperatures between about 240 degrees Celsius and about 270 degrees Celsius for between about 40 seconds and about 120 seconds.

5. The method of claim 1, wherein optically coupling the optical fibers to the optical waveguides results in a lateral alignment between the optical fibers and the optical waveguides, and wherein the lateral alignment changes by less than 1.0 micrometer following the heating and cooling steps.

6. The method of claim 1, wherein the engagement feature comprises an aperture, and wherein engaging the connector with the engagement feature comprises inserting the connector at least partially within the aperture.

7. The method of claim 1, wherein the engagement feature comprises a post, and wherein engaging the connector with the engagement feature comprises engaging the connector with the post.

8. The method of claim 1, further comprising removing the connector from the connector holder.

9. The method of claim 8, further comprising inserting at least a portion of the connector into a module wall that extends upward from the base substrate.

10. The method of claim 8, further comprising removing the connector holder from the substrate subsequent to heating the connector holder, the fiber array unit, the substrate, and the solder.

11. The method of claims 1, further comprising coupling an optoelectronic chip to the substrate.

12. The method of claim 11, further comprising optically coupling an optical source of the optoelectronic chip to the substrate.

13. The method of claim 1, wherein heating the connector holder, the fiber array unit, the substrate, and the solder further comprises heating an electronic chip and additional solder positioned between the electronic chip and the base substrate, and wherein the method further comprises cooling the additional solder to couple the electronic chip to the base substrate.

14. The method of claim 13, wherein cooling the additional solder to couple the electronic chip to the base substrate further comprises electrically coupling the electronic chip to an optoelectronic chip.

15. The method of claim 1, wherein optically coupling the optical fibers to the optical waveguides of the substrate comprises optically coupling an electromagnetic source to the connector and detecting a signal from the electromagnetic source transmitted through the optical waveguides.

16. A method for assembling an optoelectronic package assembly, the method comprising:
engaging a connector holder with a substrate, the connector holder defining an engagement feature and the substrate comprising optical waveguides;
engaging a connector of a fiber array unit with the engagement feature of the connector holder, wherein the engagement feature retains the connector, and wherein the fiber array unit further comprises optical fibers coupled to the connector;
optically coupling the optical fibers to the optical waveguides of the substrate such that there is a lateral alignment between the optical fibers and the optical waveguides;
heating the connector holder, the fiber array unit, the substrate, and a solder positioned between the substrate and a base substrate by exposing the connector holder, the fiber array unit, the substrate, and the solder to temperatures between about 240 degrees Celsius and 270 degrees Celsius; and
cooling the solder to couple the substrate to the base substrate, wherein the lateral alignment between the optical fibers and the optical waveguides changes by less than 1.0 micrometer following the heating and cooling steps.

17. The method of claim 16, wherein the engagement feature comprises an aperture, and wherein engaging the connector with the engagement feature comprises inserting the connector at least partially within the aperture.

18. The method of claim 16, wherein the engagement feature comprises a post, and wherein engaging the connector with the engagement feature comprises engaging the connector with the post.

19. The method of claims 16, further comprising removing the connector from the connector holder.

20. The method of claim 16, further comprising inserting at least a portion of the connector into a module wall that extends upward from the base substrate.

21. The method of claims 16, further comprising removing the connector holder from the substrate subsequent to heating the solder.

22. The method of claim 16, further comprising coupling an optoelectronic chip to the substrate.

23. The method of claim 22, further comprising optically coupling an optical source of the optoelectronic chip to the substrate.

24. The method of claim 16, wherein heating the connector holder, the fiber array unit, the substrate, and the solder further comprises heating an electronic chip and additional solder positioned between the electronic chip and the base substrate, and wherein the method further comprises cooling the additional solder to couple the electronic chip to the base substrate.

25. The method of claim 24, wherein cooling the additional solder to couple the electronic chip to the base substrate further comprises electrically coupling the electronic chip to an optoelectronic chip.

26. The method of claim 16, wherein optically coupling the optical fibers to the optical waveguides of the substrate comprises optically coupling an electromagnetic source to the connector and detecting a signal from the electromagnetic source transmitted through the optical waveguides.

* * * * *